United States Patent [19]

Schlig

[11] Patent Number: 5,426,430
[45] Date of Patent: Jun. 20, 1995

[54] PIPELINED CHARGE METERING DIGITAL-TO-ANALOG DATA LINE DRIVER

[75] Inventor: Eugene S. Schlig, Somers, N.Y.

[73] Assignee: International Business Machines Corporation, Armonk, N.Y.

[21] Appl. No.: 323,441

[22] Filed: Oct. 14, 1994

Related U.S. Application Data

[63] Continuation of Ser. No. 207,815, Mar. 7, 1994, abandoned, which is a continuation of Ser. No. 968,699, Oct. 30, 1992, abandoned.

[51] Int. Cl.6 .............................................. G09G 3/36
[52] U.S. Cl. ................................. 341/122; 341/124
[58] Field of Search ............... 341/122, 123, 124, 125; 340/784, 793, 811

[56] References Cited

U.S. PATENT DOCUMENTS

| | | |
|---|---|---|
| 3,390,381 | 6/1968 | Shepard, Jr. . |
| 3,836,906 | 9/1974 | Ando et al. . |
| 4,028,694 | 6/1977 | Cook et al. . |
| 4,099,175 | 7/1978 | Rubin . |
| 4,107,550 | 8/1978 | Jacquart et al. . |
| 4,145,689 | 3/1979 | Butler et al. . |
| 4,184,152 | 1/1980 | Mukawa . |
| 4,499,387 | 2/1985 | Konishi . |
| 4,584,494 | 4/1986 | Arakawa et al. . |
| 4,667,178 | 5/1987 | Ryu . |
| 4,694,341 | 9/1987 | Soneda et al. . |
| 4,713,650 | 12/1987 | Temes et al. . |
| 4,766,430 | 8/1988 | Gillette et al. .............. 340/793 |
| 4,804,863 | 2/1989 | Welland et al. . |
| 4,987,321 | 1/1991 | Toohey . |
| 5,157,386 | 10/1992 | Uchida et al. .............. 340/784 |

OTHER PUBLICATIONS

Digital Principles, 2/ed, R. L. Tokheim, 1988 p. 120.

Primary Examiner—Brian K. Young
Attorney, Agent, or Firm—David Aker

[57] ABSTRACT

A data line driver circuit having application in active matrix displays, such as thin-film transistor liquid crystal displays, uses charge metering techniques to achieve high precision and analog pipelining. Pipelining permits both the digital-analog conversion function and the presentation of the analog output to the display data line each to occupy most of the display's line time. The requirement of liquid crystals for periodic inversion of the net applied voltage is accommodated either by the circuits alone or with the display common electrode driven by a square wave.

18 Claims, 3 Drawing Sheets

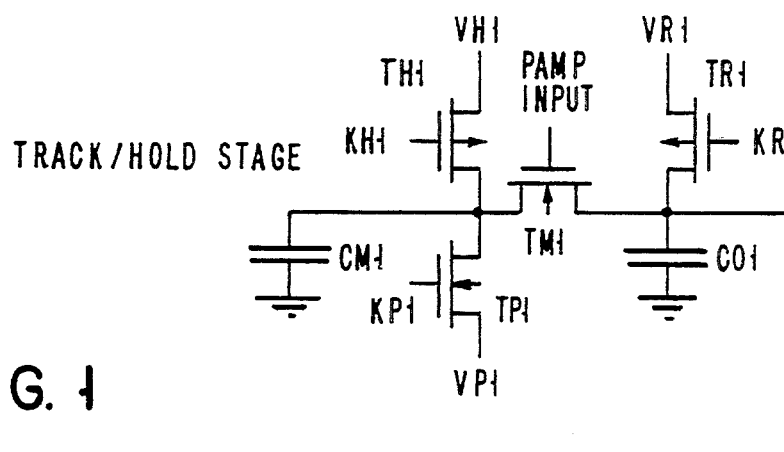
FIG. 1
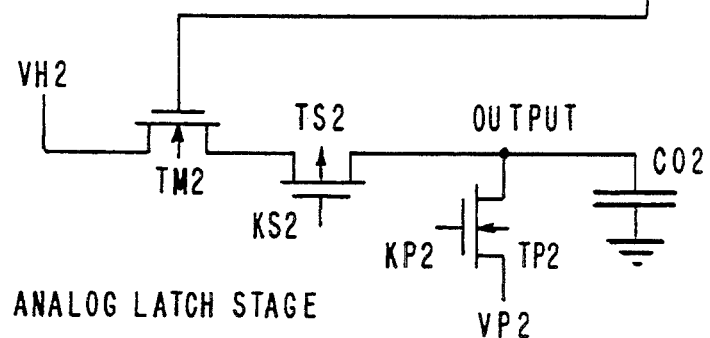
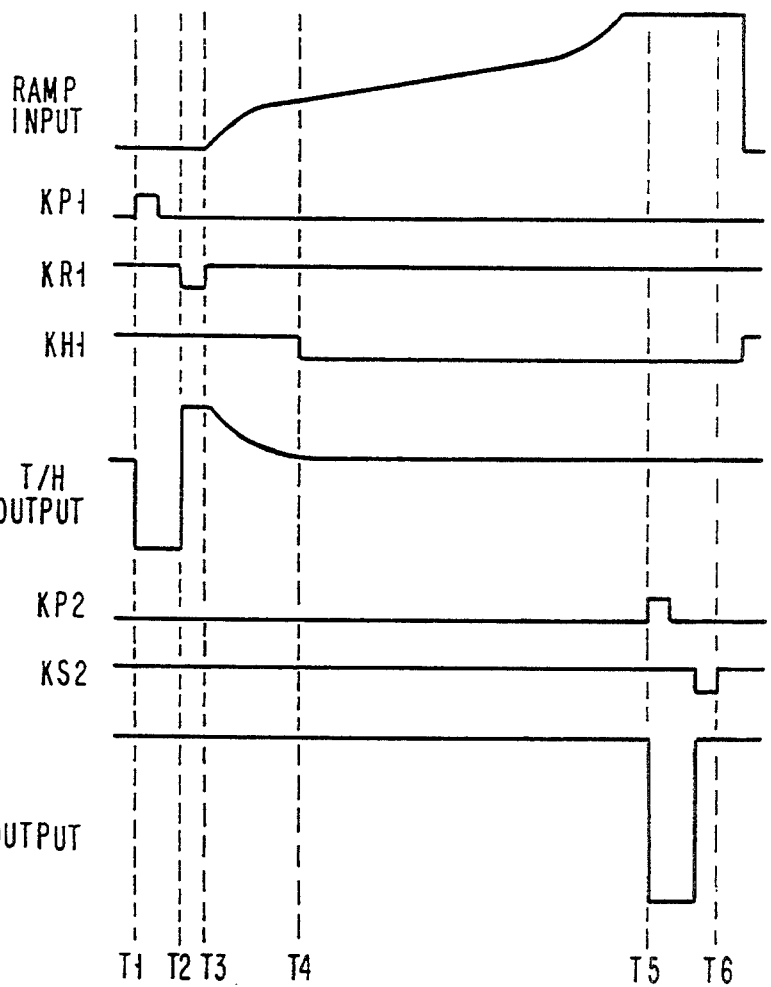

FIG. 3
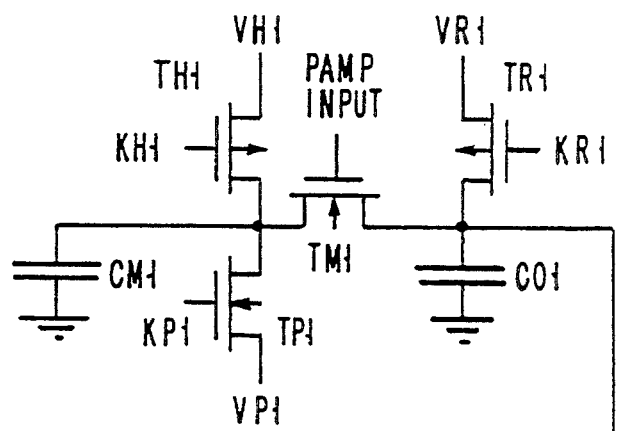
TRACK/HOLD STAGE
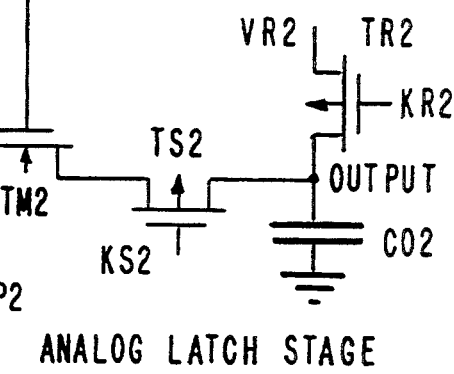
ANALOG LATCH STAGE

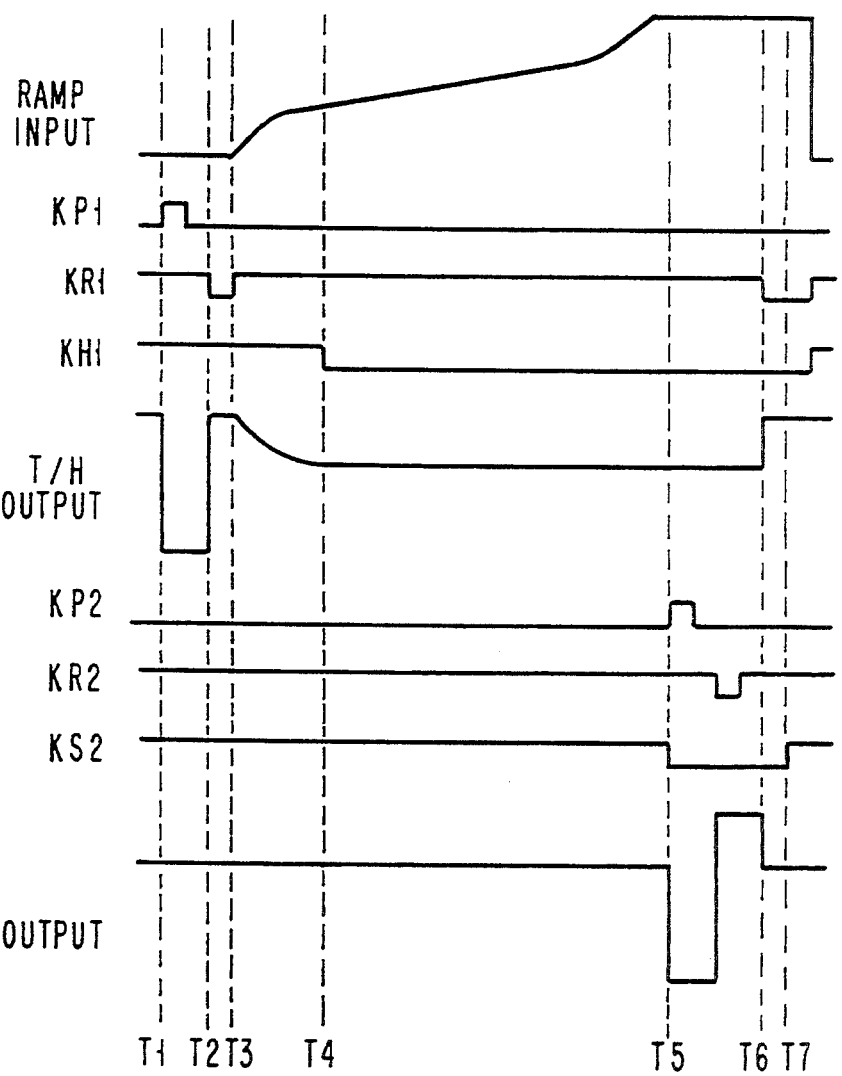

PIPELINED CHARGE METERING DIGITAL-TO-ANALOG DATA LINE DRIVER

This is a continuation of application Ser. No. 08/207,815 filed Mar. 7, 1994 which is a continuation of application Ser. No. 07/968,699, filed Oct. 30, 1992 both now abandoned.

BACKGROUND OF THE INVENTION

1. Technical Field

This invention relates to digital to analog (D/A) conversion in data line driver subsystems for flat panel active matrix displays such as thin-film transistor liquid crystal displays TFT-LCD). More specifically, it relates to the type of display which receives its pixel data in digitally encoded form and converts the digital data to analog data line signals in each data driver circuit.

2. Background Art

In the above mentioned displays the number of colors or gray levels that can be precisely displayed is limited in part by the precision and accuracy of the D/A conversion. For economic reasons, more than one hundred data driver circuits, along with associated digital circuitry, must be integrated into each monolithic silicon chip. This requirement eliminates from consideration most of the conventional means of achieving high D/A performance.

Among the more effective schemes for data line circuit D/A conversion is the sampled ramp or sampled staircase method, which is disclosed in U.S. Pat. No. 4,766,430 to Gillette et al. In this method, a ramp or staircase waveform, having a waveshape designed to provide a required nonlinear response, is distributed to all of the data line drivers. In each driver, the instantaneous amplitude of the ramp is captured and held at an instant of time corresponding to the particular digital word at each driver circuit during each display line time. The sample and hold switch which captures the ramp level usually consists of an NMOS or CMOS series switch and a hold capacitor which is usually the capacitance of a display data line. This sample and hold switch has been a weak link in this scheme. Among its limitations are the output dc level is the same as the input; and the charging current For the capacitor comes from the analog input source, thus loading the input. The analog ramp is distributed from a single generator to a large number of data line drivers, and so the generators are loaded by a very large total capacitance.

As another consequence of the foregoing, multiple stages of sample/hold cannot be cascaded without charge-sharing errors, unless buffer amplifiers are provided between stages. This creates difficulty in using analog pipelining without introducing excessive error. Further, in high bandwidth sample/hold applications such as display data drivers, the transistor channel becomes wide, leading to so-called pedestal errors due to coupling of the control signal through stray capacitance and injection into the output of charge stored in the transistor channel. Dummy switches and operational amplifiers are often added for optimal performance, but would be impractical in the display application due to the large number of circuits on each chip.

In the present application, as the number of pixels in the display and the number of gray levels becomes larger, the bandwidth, precision and accuracy required of the sampling switch increase. Due to the limitations cited above, no sampled ramp data driver circuits have been designed which satisfy near-future display requirements.

Another requirement of liquid crystal displays is that the voltage waveform appearing across the cell in response to the pixel data have a negligible average dc component. This is achieved at present in either of two ways. A first approach shifts the voltage applied to the data lines at intervals such that, relative to a fixed voltage applied to the common liquid crystal electrode, the net voltage across the liquid crystal effectively reverses at that interval. A second approach achieves the net reversal in part by applying a square-wave drive to the common electrode to shift its voltage intervals. The latter approach is used to reduce the voltage requirement of the data line drivers.

SUMMARY OF THE INVENTION

In copending application Ser. No. 07/968,698, filed on Oct. 30, 1992, entitled "Charge Metering Sampling Circuit And Use TFT/LCD', the teaching of which is hereby incorporated by reference, the present inventor has set forth a novel sampling circuit which overcomes those limitations. The invention described herein utilizes the charge metering technique set forth in the above mentioned copending application in novel sampled ramp or staircase data line driver circuitry, in order to extend the utility of these circuits to larger displays with more gray levels and better color fidelity, while maintaining economic practicality.

It is an object of the invention to provide a data driver circuit which operates in either the voltage shift mode or square-wave application mode, described above.

The invention relates primarily to the track and hold portion of the D/A converter and to the analog latch portion. The digital portion of the data line driver is known in the art and is set forth in the Gillette patent cited above (which is incorporated herein by reference) and in numerous technical articles, and will be described herein only briefly.

The invention is embodied in circuits which perform two functions and preferably are in the form of two CMOS stages. They are a track and hold (T/H) stage and an analog latch stage.

The T/H stage is a charge metering sampling circuit preferably using an NMOS metering switch and operating in the inverting, negative output change mode. At the start of an operating cycle the T/H is initialized by operating a precharging switch and a reference setting switch in sequence. The latter provides a precise initial output voltage. The metering switch then receives as an input an analog ramp or staircase waveform. The word "ramp" will generally be used herein to refer to either a ramp or staircase. The circuits and their operation are the same for either. A digital word is supplied to the data line driver subsystem and used in known ways to determine the time following the beginning of the ramp that a hold signal is generated and supplied as a control input to the T/H.

The positive-going input ramp causes transfer of negative charge from a metering capacitor to a storage capacitor, resulting in a negative going output voltage across the storage capacitor. The voltage across the storage capacitor is the output of the stage. The start of the hold signal causes the output to be held at its value at that time for the remainder of the input ramp's duration. After the end of the input ramp, the reference setting switch may optionally be turned on a second time to restore the output to its initial value, creating an output voltage change equal to the amplitude of the held portion of the input ramp voltage change but opposite in sense. Thus a noninverted output is provided in the inverting mode during a short period at the end of the operating cycle. This feature is used to provide for analog pipelining when the inverting mode is employed in the analog latch stage.

The analog latch stage may use the inverting or noninverting mode. With the inverting mode, the aforementioned final output step is presented as the input to the charge metering switch. The stage operates much like the T/H stage; after the precharging and reference setting operations, it samples the final output step of the T/H stage and generates a corresponding inverted output which it latches by means of a latch switch for the next line time as the input to the corresponding display data line.

When the analog latch stage uses the noninverting mode, the final output step is not generated or used. After the completion of the ramp and while the held output from the T/H is presented to the analog latch stage as input, the storage capacitor is precharged and the output latch switch is turned on to allow the storage capacitor to discharge to a voltage corresponding to the input. Then the output latch switch is turned off to latch the output for the next display line time.

While the T/H is processing the current datum, the analog latch stage is storing the analog equivalent of the previous datum and presenting it to the data line of the display. By means of this pipelining both the duration of the ramp and the duration of each output to the data line may be almost a full line time.

For the type of operation in which the data line driver circuits must periodically shift the level of the output relative to a fixed display common electrode voltage, two alternatives are provided in the first a switchable reference voltage is supplied to the last stage which uses the inverting mode. In the second two reference setting switches and two reference voltage supplies are employed in that stage.

BRIEF DESCRIPTION OF THE DRAWINGS

FIG. 1 is a schematic diagram of a preferred embodiment of the invention using a noninverting final stage.

FIG. 2A to FIG. 2H are waveform tinning diagrams for the circuit of FIG. 1.

FIG. 3 is a schematic diagram of an alternative embodiment of the invention with an inverting final stage.

FIG. 4A to FIG. 4I are waveform timing diagrams for the circuit of FIG. 3.

DETAILED DESCRIPTION OF THE INVENTION

This invention is generally embodied as CMOS integrated circuits on a silicon chip. It uses the charge metering sampling circuits of the copending application to perform two functions of the sampled-ramp type of data line driver for active-matrix liquid crystal display panels. To satisfy the unique requirements of such a system, the circuits are configured anal operated in new ways. In the schematic diagrams of FIG. 1 and FIG. 3 NMOS transistors are identified by an arrow directed at the device and PMOS transistors by an arrow directed away from the device. As explained in the copending application, the types of all the transistors except those in the charge metering switch are matters of engineering choice. That of the charge metering switch partly determines the mode of operation. Capacitors are generally integrated into the chip and share a common electrode, such as the silicon substrate. The final output capacitor CO2, however, is generally the capacitance of a display data line.

Looking at one of the many data line drivers of a display, its digital portion receives a digital word representing a gray level or color component and, in effect, converts it to a time interval. The time interval determines when an analog ramp or staircase waveform, which is presented simultaneously to all the data line drivers, is sampled and held in the present driver, thus determining the output voltage. The first of the two stages of the present invention is the track and hold (T/H), which tracks the ramp waveform and holds the selected value. The second is an analog latch which latches the output of the T/H stage and applies it to the corresponding display data line for most of a display line time, while the preceding stage simultaneously converts the next datum. This analog pipelining allows both the ramp duration and the output duration to be most of a line time, minimizing the speed required of the circuits and the display panel.

To avoid deterioration of the liquid crystal material, periodic inversion of the net voltage across the display cells is required. This may be accomplished either entirely by the data line drivers, or partly by applying a square wave to the display common electrode. Both are known in the art. In the former case the inversion is accomplished by shifting the overall level of the output relative to a fixed display common electrode voltage, and simultaneously inverting the logical significance of the range of analog output levels. This means that if the lowest analog level corresponds to the darkest display in a first state, it will correspond to the brightest display in the second, inverted state. On the other hand, when a square wave is applied to the common electrode the overall output level of the data line driver is fixed, but the logical significance of the range of analog levels still must be inverted in synchronism with the square wave. The flexibility of the charge metering sampling circuit allows an appropriately configured embodiment of the invention to operate either way. In describing the circuits and their operation, it will be initially assumed that the overall output level of the data line driver is fixed. Ways of providing for shifting the level will subsequently be described.

In the prior art, ramp waveforms are usually supplied to the data line drivers in alternating polarities to provide for the required periodic inversion. Charge metering circuits are capable of accepting such ramps as inputs and are equally capable of accepting a ramp input of one polarity and periodically inverting it under the control of their clocking or control input signals. One acquainted with the copending application will understand how those options may be implemented. However, those options require the use of PMOS devices in the charge metering switch of one or both stages of the invention. It is known that PMOS devices are inferior to NMOS in performance and layout economy, so a preferred embodiment is described here which uses only NMOS devices in the charge metering switches of the stages and only positive-going ramps. To accomplish the inversion of the logical significance of the analog levels, the digital data is periodically logically inverted, for instance by means of exclusive-or circuits (as is well known in the art), and the waveshape of the ramp is correspondingly periodically altered (to account for the shape of the transmittance-voltage curve of the liquid crystal) such that the displayed intensity and color are unaffected by the inversion.

With the use of NMOS charge metering switches, two modes of operation are available in charge metering sampling circuits; inverting, negative output change and noninverting, positive output change. In a two-stage embodiment of the invention, the T/H stage preferably uses the inverting mode but the analog latch stage may operate in either mode. The copending application teaches that charge metering circuits may be configured in a general form that operates in different modes depending on the specific control signals, but in the interest of clarity circuits embodying specific modes will be separately described herein.

The inverting mode provides an output with an overkill dc level determined by a reference voltage supply and not by the input level or by circuit components. The gain or attenuation in the inverting mode is governed by the ratio of two capacitances. The noninverting mode has an output with an overall dc level determined by the input and the threshold voltage of the charge metering switch device. The gain in the noninverting mode is slightly less than unity.

A description will first be presented of a preferred embodiment of a data line driver using a T/H stage operating in the inverting, negative output change mode and an analog latch operating in the noninverting positive output change mode.

Referring to FIG. 1 and FIG. 2, at the start of an operating cycle, the input ramp is at its initial low level, KP1 is low causing transistor TP1 to be off, KH1 is high causing transistor TH1 to be off and KR1 is high causing transistor TR1 to be off. KP1 rises at time T1 to precharge capacitor CM1 to low potential VP1, below the initial channel potential of transistor TM1. Capacitor CO1 will also receive some negative charge in the process. Transistor TP1 is turned off and KR1 Falls to turn on transistor TR1 at time T2. Capacitor CO1 charges to high potential VR1 and capacitor CM1 discharges through transistor TM1 until its voltage is in equilibrium with the channel potential of transistor TM1, a threshold below the initial level of the ramp input. The charge spilled from capacitor CM1 is absorbed by the VR1 source. VR1 determines the initial value of the final output to the display data line. Transistor TR1 is turned off and the ramp begins to rise at time T3. A nonlinear "reversed S-shaped" ramp is typically used. As the ramp rises, additional negative charge is transferred from capacitor CM1 to capacitor CO1, thus reducing the voltage across capacitor CO1 accordingly. The ratio of the voltage change across capacitor CO1 to the input voltage change is the gain, which is approximately $-CM1/CO1$. The gain may be very accurately established due to the inherent tracking of the magnitude of closely spaced capacitors in a semiconductor chip. The gain is a matter of engineering choice and will be taken here as $-1$ for clarity and convenience. Time T4 marks the end of the time interval corresponding to the assumed digital datum being processed. At time T4 digital circuits not shown or part of the invention cause KH1 to fall, turning on transistor TH1 to charge capacitor CM1 to high potential VH1 so that no further charge is available for transfer to capacitor CO1, although the ramp may continue to rise. Thus the voltage across capacitor CO1 at time T4 is held until the end of the operating cycle. At time T5, after the end of the ramp, the operation of the analog latch stage begins.

This stage samples the voltage across capacitor CO1, produces a corresponding output change, and latches the output for most of a display line time. During that time the first stage is processing the next datum.

Transistor TP2 and transistor TS2 are initially turned off so the previous output voltage is being held or latched across capacitor CO2. At lime T5, KP2 rises to turn on transistor TP2, precharging capacitor CO2 to low potential VP2. Then transistor TP2 is turned off and KS2 falls to turn transistor TS2 on. Capacitor CO2 discharges through transistor TS2 and transistor TM2 until its voltage is in equilibrium with the channel potential of transistor TM2. Charge spilled from capacitor CO2 is absorbed by the VH2 supply. At T5 time the gate input to transistor TM2 corresponds to the analog output of the D/A, so the output voltage actress capacitor CO2 at equilibrium is the required output to the data line of the display. As a rule, capacitor CO2 will be the capacitance of the data line itself. When the output has settled at time T6, transistor TS2 is turned off to latch the new output voltage until the next operating cycle. Transistor TS2 must be designed with the minimum applicable channel width to avoid excessive pedestal error when it turns off. The speed requirement is low in this stage, and pedestal error is therefore easily avoided. Finally, transistor TH1 is turned off and the ramp returns to its initial value to complete the operating cycle.

An advantage of the noninverting analog latch in this application is that the data line capacitance may be used as the storage capacitor CO2 without introducing gain variability due to lack of tracking between capacitors. It is also simplest, requires fewest control signals and occupies the least silicon area.

In the embodiment of FIG. 1, the output latching switch consisting of PMOS transistor TS2 may optionally have an added NMOS transistor connected across it, source to source and drain to drain. The gate of the NMOS transistor receives the complement of the signal applied to the PMOS transistor. This option speeds up the operation of the second stage.

A disadvantage of the noninverting analog latch is that its output has a dc level which depends upon the threshold voltage of metering switch transistor TM2. In the case of the embodiment of FIG. 1, a larger threshold voltage of transistor TM2 results in a lower dc lever at the output. However, in the circuit of FIG. 1 compensation for threshold voltage variability may be performed relatively easily, by making voltage VR1 directly variable with device threshold. This may be done on a circuit by circuit basis, or by groups of closely spaced circuits on each chip, or on a chip by chip basis. Fortunately, most of the variability in device threshold voltage is that from chip to chip, so it will often be sufficient to compensate for threshold variation by deriving VR1 from an on-chip threshold compensating voltage source, as is known in the art, and distributing it to all data line drivers on the chip.

Referring to FIG. 3 and FIG. 4, both stages of the data line driver operate in the inverting mode. The operation of the T/H stage is the same as for the circuit of FIG. 1 until a time after the end of the ramp at time T5. However, in this case VR1 does not determine the initial voltage on the display data line. VR1 thus becomes a matter of engineering choice.

Before time T5 transistors TP2, TR2 and TS2 of the analog latch stage are turned off and the previous analog output has been presented to the display data line for most of the line time. At time T5, KS2 falls to turn on transistor TS2. Then KP2 rises to turn on transistor TP2 to precharge capacitor CM2 to a low voltage, below the lowest channel potential that transistor TM2 can reach. Capacitor CO2 will also receive some negative charge in the process. Then transistor TP2 is turned off and KR2 falls to turn on transistor TR2, charging capacitor CO2 to a high potential corresponding to the required initial output voltage. Capacitor CM2 spills excess charge until the voltage across it equilibrates with the channel potential of transistor TM2. The spilled charge is absorbed by the VR2 supply. Transistor TR2 then turns off.

At time T6, the T/H stage must present at its output a positive-going voltage step equal in amplitude to the previous negative change which corresponds to the part of the input ramp which was tracked and held. The positive step is produced by lowering KR1 to turn on transistor TR1 a second time, restoring the voltage across capacitor CO1 to its initial value VR1. This step is, in effect, a noninverted output from the inverting mode T/H stage which occurs within a short time interval near the end of the operating cycle. It permits the use of an NMOS charge metering switch in the inverting analog latch stage and also permits that stage to present its latched output to the data line for most of a display line time. This is the key to analog pipelining with an inverting analog latch.

The positive step at the gate of transistor TM2 at time T6 causes a corresponding amount of negative charge to be transferred from capacitor CM2 to capacitor CO2, lowering the output voltage by an amount corresponding to the value of the digital input to the data line driver. The gain of the stage is approximately −CM2/CO2, which we will take here as −1 for clarity and convenience.

At time T7, KS2 rises to turn off transistor TS2, isolating capacitor CO2 and making the output immune to subsequent changes in the input, thus latching the analog output. Transistor TS2 must be designed with the minimum applicable channel width to avoid excessive pedestal error when it turns off. The speed requirement is low in this stage, and pedestal error is therefore easy to avoid. A hold switch comparable to transistor TH1 may be used in place of transistor TS2, but transistor TS2 is preferred because it isolates the output from possible errors due to coupling through the stray capacitance of transistor TM2. Finally, transistor TR1 and transistor TH1 are turned off and the ramp returns to its initial value to complete the operating cycle.

An advantage of the inverting analog latch in this application is that the initial output voltage is very precisely set by the reference selling switch TR2 and voltage supply VR2 and does not depend on device threshold voltage. An additional advantage is the design flexibility accorded by its designable gain. Its disadvantage in this application arises from the nature of the load, i.e. the display data line. This line appears as a rather large capacitive load, typically more than 100 picofarads. If no buffer amplifier is to be used between the second stage and the load, there is little choice but to use the data line capacitance as the storage capacitor of the second stage; capacitor CO2. Therefore capacitor CM2 and capacitor CO2 do not track, but vary independently, so a comparatively large variability in the gain front circuit to circuit and chip to chip will occur. This embodiment is also more complex, uses more control signals and occupies more silicon area.

The gain variability of the inverting mode is less readily corrected than the threshold dependent output of the noninverting mode. The noninverting mode is therefore generally preferred for high precision displays.

Either embodiment, FIG. 1 or FIG. 3, may be adapted to provide for periodic inversion of the liquid crystal voltage by means of shifting of the overall output level of the data line driver. This may be accomplished in either of two waves. The first way requires no change in the circuits. Instead, the voltage VR1 of FIG. 1, or VR2 of FIG. 3, is switched at its source between two values, both having correction for threshold voltage variation if required. The second way is to replace reference switch transistor TR1 (FIG. 1) or transistor TR2 (FIG. 3) with a pair of reference switches TRA and TRB (neither shown) connected to two voltage supplies VRA and VRB (neither shown), which may be threshold corrected if required, and to two control signals KRA and KRB (neither shown), respectively. The overall output level is shifted as the control signals, KRA or KRB, are activated alternately in alternate operating cycles.

One or more additional bits may be added to the precision of the charge metering D/A without altering the number of steps, the step amplitudes, or the duration of the staircase waveform. The most attractive embodiment, that of one additional bit at the least significant position, will be described. The method involves shifting the output of the D/A by a voltage equal to the analog equivalent of the new least significant bit (LSB).

In the circuits of FIGS. 1 and 3, two values of reference voltage VR1 are to be provided, VR1A and VR1B, differing by the analog equivalent of the new LSB. In the case of a nonlinear staircase waveform, the analog equivalent of the LSB depends on the datum, so the difference between the VR1 values will preferably be the minimum value of the analog equivalent, corresponding to the shallowest portion of the staircase and the added output levels will be mostly useful in that part of the analog output range. The preferred way of applying the two references to the circuit is by means of two reference switch devices, TR1A and TR1B respectively, each having one of its source/drain electrodes connected to the respective reference voltage source and the other connected as usual to the output node of the circuit. The gate electrodes are connected to control signals KR1A and KR1B respectively. Following the assumptions underlying the description set forth above, the reference switch devices is assumed to be PMOS. It is also assumed that VR1A is the higher potential.

In the circuit of FIG. 1 as it would be modified, at time T2 the binary value of the LSB determines which reference switch device is turned on. For binary-0, KR1A goes low while KR1B stays high, so only TR1A turns on and capacitor CO1 is charged to VR1A. For binary-1, only KR1B goes low so only TR1B turns on and capacitor CO1 is charged to VR1B.

In the circuit of FIG. 3 as it would be mollified, the operation at time T2 is the same as that described in the previous paragraph. At time T6 the reference switch is operated a second time, but only KR1A goes low regardless of the digital data. Therefore, at that time capacitor CO1 always charges to VR1A. In the circuit of FIG. 3, it is alternatively possible to apply this method to the reference switch of the second stage rather than the first, in which case it utilizes the timing of signal KR2 (FIG. 4G) and the procedure described above for time T2.

While this invention has been described in connection with the preferred embodiments, it will be understood that those with skill in the art may be able to develop variations of the disclosed embodiment without departing from the spirit of the invention or the scope of the following claims:

I claim:

1. A data line driver comprising:

a charge metering track and hold circuit which tracks and inverts an input voltage and provides at a first output a held voltage indicative of magnitude of said input voltage at a sample time, said track and hold circuit including a first transistor having a source, a gate and a drain; a first capacitor coupled between one of said source and said drain of said first transistor and a circuit common; a second capacitor coupled between a second of said source and said drain and said circuit common; means for precharging said first capacitor to a first potential; means for precharging said second capacitor to a second potential; means for applying an input signal to said gate of said first transistor; and biasing means for biasing said first transistor so as to isolate said second capacitor from said first capacitor and from said input signal; and noninverting latch means having an input connected to said first output, said latch means latching a representative voltage which is representative of said held voltage and providing at a second output said representative voltage.

2. The data line driver of claim 1 further comprising control means for permitting said latch means to hold a voltage value representative of a first input to said track and hold circuit while said track and hold circuit is tracking a second input.

3. The data line driver of claim 1 wherein said latch means has an output capacitor for holding said representative voltage, said output capacitor comprising capacitance of said data line.

4. The data line driver of claim 1 wherein said latch means comprises:

an output capacitor for holding said representative voltage; and means for precharging said capacitor.

5. The data line driver of claim 3 wherein the data line is the data line of an active matrix display.

6. The data line drive of claim 1 wherein said sampling time is representative of a value of a digital word.

7. The data line drive of claim 2 wherein said control means comprises a MOSFET.

8. The data line drive of claim 2 wherein said control means comprises two MOSFETS of complementary conductor types connected in parallel.

9. The data line driver of claim 1 wherein said charge metering track and hold circuit presents at said first output a voltage step in said first output voltage indicative of said held voltage.

10. A data line drive comprising:

a charge metering track and hold circuit which tracks and inverts an input voltage and provides at a first output a held voltage indicative of magnitude of said input voltage at a sample time, said track and hold circuit including a first transistor having a source, a gate and a drain; a first capacitor coupled between one of said source and said drain of said first transistor and a circuit common; a second capacitor coupled between a second of said source and said drain and said circuit common; means for precharging said first capacitor to a first potential; means for precharging said second capacitor to a second potential; means for applying an input signal to said gate of said first transistor; and biasing means for biasing said first transistor so as to isolate said second capacitor from said first capacitor and from said input signal; and inverting latch means having an input connected to said first output, said latch means latching a representative voltage which is representative of said held voltage and providing at a second output said representative voltage.

11. The data line driver of claim 10 further comprising control means for permitting said latch means to hold a voltage value representative of a first input to said track and hold circuit while said track and hold circuit is tracking a second input.

12. The data line driver of claim 10 wherein said latch means has an output capacitor for holding said voltage, said representative output capacitor comprising capacitance of said data line.

13. The data line driver of claim 10 wherein said latch means comprises an output capacitor for holding said representative voltage; and means for precharging said capacitor.

14. The data line driver of claim 12 wherein the data line is the data line of an active matrix display.

15. The data line drive of claim 10 wherein said sampling time is representative of a value of a digital word.

16. The data line drive of claim 11 wherein said control means comprises a MOSFET.

17. The data line drive of claim 11 wherein said control means comprises two MOSFETS of complementary conductor types connected in parallel.

18. The data line driver of claim 5 wherein said charge metering track and hold circuit presents at said first output a voltage step in said first output voltage indicative of said held voltage.

* * * * *